(12) United States Patent
Vaartstra

(10) Patent No.: US 6,368,518 B1
(45) Date of Patent: Apr. 9, 2002

(54) METHODS FOR REMOVING RHODIUM- AND IRIDIUM-CONTAINING FILMS

(75) Inventor: Brian A. Vaartstra, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/382,506

(22) Filed: Aug. 25, 1999

(51) Int. Cl.$^7$ .............................. B44C 1/22; C23F 1/00
(52) U.S. Cl. .................... 216/67; 216/75; 252/79.1; 438/720; 438/742
(58) Field of Search .................. 216/58, 67, 75, 216/76; 438/650, 712, 720, 722, 742; 252/79.1

(56) References Cited

U.S. PATENT DOCUMENTS

| | | |
|---|---|---|
| 4,992,137 A | 2/1991 | Cathey, Jr. et al. |
| 5,254,217 A | 10/1993 | Maniar et al. |
| 5,380,401 A | 1/1995 | Jones et al. |
| 5,711,851 A | 1/1998 | Blalock et al. |
| 5,786,259 A | 7/1998 | Kang |
| 5,888,906 A | 3/1999 | Sandhu et al. |
| 6,143,191 A * | 11/2000 | Baum et al. .............. 216/75 X |
| 6,149,828 A | 11/2000 | Vaartstra |
| 6,211,034 B1 * | 4/2001 | Visokay et al. ......... 438/720 X |

OTHER PUBLICATIONS

Canterford et al., Halides of the Second and Third Row Transition Metals (Halides of the Transition Elements), Interscience, New York, p. 347, 350 (1968).

DeOrnellas et al., "Challenges for Plasma Etch Integration of Ferroelectric Capacitors in FeRAM's and DRAM's," *Integrated Ferroelectrics*, 17, 395–402 (1997).

DeOrnellas et al., "Plasma Etch of Ferroelectric Capacitors in FeRAMs and DRAMs," *Semiconductor International*, 20:10, 103–104, 106, 108 (1997).

Kim et al., "Chemical Dry Etching of Platinum Using $Cl_2$/CO Gas Mixture," *Chem. Mater.*, 10, 3576–3582 (1998).

Kwon et al., "Etching Properties of Pt Thin Films By Inductively Coupled Plasma," *J. Vac. Sci. Technol.*, A 16(5), pp. 2772–2776 (1998).

Xu et al., "Chemical Vapor Deposition (CVD) of Iridium and and Platinum Films and Gas–Phase Chemical Etching of Iridium Thin Films," *Mat. Res. Soc. Symp. Proc.*, 541, 129–139 (1999).

* cited by examiner

Primary Examiner—William A. Powell
(74) *Attorney, Agent, or Firm*—Mueting, Raasch & Gebhardt, P.A.

(57) ABSTRACT

A method for removing an iridium- and/or rhodium-containing material from a substrate, such as a semiconductor-based substrate, is provided. The method includes providing a substrate having an exposed iridium- and/or rhodium-containing material and exposing the substrate to a composition that includes at least one halogen-containing gas, whereby at least a portion of the exposed iridium- and/or rhodium-containing material is removed from the substrate.

40 Claims, 3 Drawing Sheets

000000000
METHODS FOR REMOVING RHODIUM- AND IRIDIUM-CONTAINING FILMS

FIELD OF THE INVENTION

This invention relates to methods for removing inorganic material, particularly rhodium- and iridium-containing films, on substrates such as semiconductor-based substrates.

BACKGROUND

Films of metals and metal oxides, particularly rhodium (Rh) and iridium (Ir), are becoming important for a variety of electronic and electrochemical applications. These metal-containing films are generally unreactive toward silicon and metal oxides, resistant to diffusion of oxygen and silicon, and are good conductors. Oxides of these metals also possess these properties, although perhaps to a different extent. Thus, films of Rh and Ir have suitable properties for a variety of uses in semiconductor-based substrates (e.g., integrated circuits). For example, they can be used in integrated circuits for electrical contacts. They are particularly suitable for use as barrier layers between the dielectric material and the silicon substrate in memory devices, such as ferroelectric memories. Furthermore, they may even be suitable as the plate (i.e., electrode) itself in capacitors. Iridium oxide is of particular interest as a barrier layer because it is very conductive (30–60 $\mu\Omega$-cm) and is inherently a good oxidation barrier.

In the fabrication of semiconductor integrated circuits (ICs), various layers of inorganic material are patterned in desired shapes. The resulting inorganic layers form individual devices and interconnect structures within the IC. Patterning conventionally includes masking an underlying layer with an organic resist material, such as photoresist, exposing the resist, and removing exposed areas of the mask to form a patterned mask layer. The exposed inorganic layer underlying the patterned mask layer is then removed using an appropriate etchant. The patterned mask layer is then removed;

Etching is a process for removing unwanted material (i.e., partial or complete layers of material) from a surface (e.g., the surface of a semiconductor-based substrate). Organic or inorganic material, which may be patterned or unpatterned, of a substrate surface can be removed using an etching technique. Ideally, etching should precisely remove material that is not covered by a patterned mask layer (i.e., material that is "exposed" when a patterned mask layer is used).

The etchant is typically chemically varied according to the type of material being etched. Etchants are characterized as isotropic or anisotropic. Isotropic etchants remove material in all directions at the same rate. Anisotropic etchants do not remove material in all directions at the same rate. Etchants are further characterized as being selective or non-selective, depending on their ability to differentiate between material that they effectively etch. Selective etchants remove different types of material at different rates.

Etching can occur in a wet or dry processing environment. Wet etching refers to the contact of a substrate surface with a liquid chemical etchant. Material is removed as an agitated liquid or spray, for example, passes over the substrate surface. Dry etching typically refers to the contact of a substrate surface with a gaseous etchant, typically a plasma etchant, although chemical etching is also used. While wet etchants have many preferable characteristics as compared to dry etchants, dry etchants are most often used for anisotropic etching and can be used in semiconductor fabrication without the need to dry the substrate being processed after an etching step. The added step of drying the substrate that is required when using a conventional wet etchant adds to the cost of semiconductor device fabrication. Another advantage of etching with a dry etchant is that it often decreases the safety hazards associated with wet etchants due to the relatively small amount of chemicals utilized in the dry etchant.

One of the challenges for integrating Rh and Ir into semiconductor-based substrates is the ability to dry etch such a metal. These metals are generally unreactive and are known to form nonvolatile products with many common etch gases. One report of chemically etching an iridium film appears in Xu et al., *Proc. Mater. Res. Soc.*, Fall 1998, which uses $XeF_2$. One observation indicated in this report is that no etching is observed without the presence of bare silicon. Additionally, $XeF_2$ is an expensive material and would add an undesirable cost to the semiconductor manufacturing process.

Thus, an etching composition and method of etching (or otherwise removing) rhodium- and iridium-containing films from substrates, such as in the fabrication of semiconductor-based substrates, particularly ICs, is needed. Preferably, a method is needed that achieves an effective, highly uniform removal of material across a substrate.

SUMMARY

A method for removing (preferably, etching) a metal-containing material is provided. The method includes providing a substrate having an exposed metal-containing material that includes rhodium, iridium, or a combination thereof, and exposing the substrate to a composition (preferably, an etching composition) that includes at least one halogen-containing gas (i.e., halide gas) to remove at least a portion of the metal-containing material from the substrate. The substrate is preferably a semiconductor-based substrate or substrate assembly, such as a wafer, used in semiconductor structures, although the metal-containing material can be on a wide variety of substrates, including the interior of an etching chamber or deposition chamber. Typically and preferably, the metal-containing films are electrically conductive. The resultant films can be used as barrier layers or electrodes in an integrated circuit structure, particularly in a memory device such as a ferroelectric memory device. For example, the metal-containing material can form an electrode in a high-k dielectric capacitor (i.e., a capacitor that includes a material having a high dielectric constant).

The metal-containing film can include pure iridium, pure rhodium, or an alloy containing iridium and/or rhodium and one or more other metals (including transition metals, main group metals, lanthanides) and/or metalloids from other groups in the Periodic Chart, such as Si, Ge, Sn, Pb, Bi, etc. Furthermore, for certain preferred embodiments, the metal-containing film can be an oxide, nitride, sulfide, selenide, silicide, or combinations thereof. Thus, in the context of the present invention, the term "metal-containing film" includes, for example, relatively pure films of iridium, relatively pure films of rhodium, alloys of iridium or rhodium with each other or with other Group VIII transition metals such as nickel, palladium, platinum, iron, ruthenium, and osmium, metals other than those in Group VIII, metalloids (e.g., Si), or mixtures thereof. The term also includes complexes of iridium, rhodium, iridium alloys, or rhodium alloys with other elements (e.g., O, N, and S). The terms "single transition metal film" or "single metal film" refer to relatively pure films of iridium or rhodium. The terms "transition metal alloy film" or "metal alloy film" refer to films of iridium or rhodium in alloys with each other or other metals or metalloids, for example. Thus, herein the metal-containing material is also referred to as an iridium- and/or rhodium-containing material.

The substrate can have a patterned mask layer thereon, wherein the iridium- and/or rhodium-containing material removed from the substrate includes exposed iridium- and/or rhodium-containing material under the patterned mask layer. The iridium- and/or rhodium-containing material can also be removed from the substrate in an unpatterned manner (i.e., without the presence of a patterned mask layer on the substrate).

In one embodiment, the method of removing an iridium- and/or rhodium-containing material uses a preferred composition that includes at least one halogen-containing (i.e., halide) gas and at least one auxiliary gas. The halide gas may be capable of removing material (e.g., etching) without an additional component, depending on the material being removed. If; however, the halide gases are not capable of removing material in and of themselves, an auxiliary gas is used that is capable of enhancing the removal. Whether an auxiliary gas is used or not, the composition may also optionally include a source of oxygen because the resultant rhodium and iridium oxyhalides are generally volatile.

The halide gas is a halogen-containing gas (i.e., a gas containing one or more elements from Group VIIA (Group 17) of the Periodic Table). For certain embodiments, this does not include $XeF_2$. For other embodiments, the halogen-containing gas is one that optionally includes hydrogen or elements from Groups IIIA (Group 13), IVA (Group 14), VA (Group 15), VIA (Group 16) of the Periodic Table, or mixtures thereof. Preferably, the auxiliary etching component is selected from the group of carbon monoxide (CO), nitric oxide (NO), alkylphosphines, isocyanides, and combinations thereof. Preferably, the source of oxygen is selected from the group of oxygen ($O_2$), NO, $N_2O$, $NO_2$, oxyhalides, $H_2O$, $H_2O_2$, $CO_2$, $SO_2$, $SO_3$, $O_3$, and combinations thereof.

DETAILED DESCRIPTION PREFERRED EMBODIMENTS OF THE INVENTION

Figure 1:
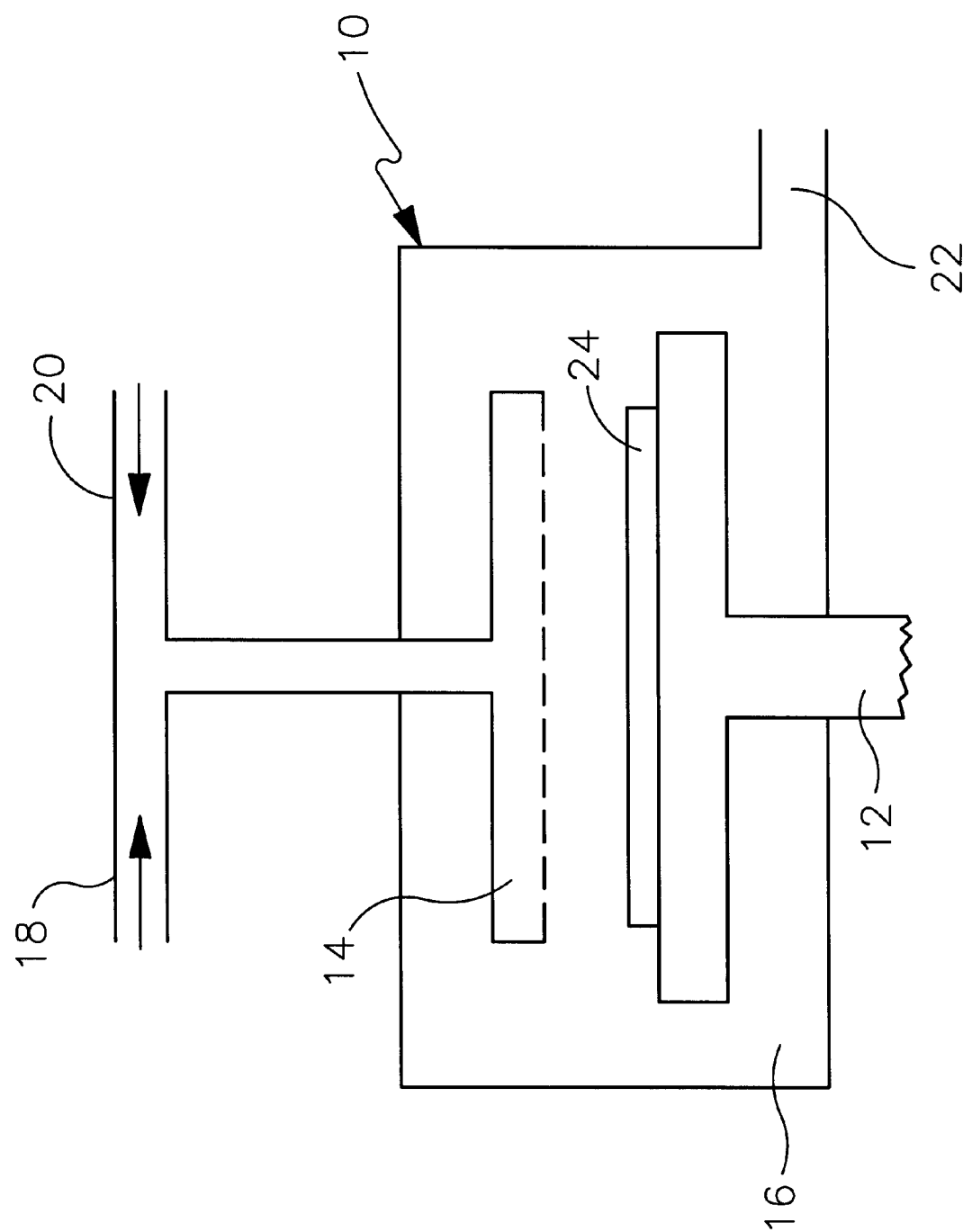
FIG. 1 is a schematic representation of a reaction vessel for use in etching in accordance with the present invention.

The present invention is directed to the use of a composition capable of removing (e.g., etching) metal-containing material. The composition includes at least one halogen-containing gas. The following description is illustrative of various embodiments of the invention. It is to be understood that the term substrate, as used herein, includes a wide variety of semiconductor-based substrates or substrate assemblies that can be etched, or other substrates containing metal-containing films. A substrate can be a single layer of material, such as a silicon (Si) wafer. Substrate is also to be understood as including silicon-on-sapphire (SOS) technology, silicon-on-insulator (SOI) technology, doped and undoped semiconductors, epitaxial layers of silicon (Si) supported by a base semiconductor, as well as other semiconductor-based structures, including any number of layers as is well known to one skilled in the art. Furthermore, when reference is made to a substrate in the following description, previous process steps may have been utilized to form regions/junctions in a base semiconductor structure. It is also important to note that the substrate from which metal-containing material is removed can have a patterned mask layer thereon, such as, for example, a patterned resist layer, but it is not required. The following detailed description is, therefore, not to be taken in a limiting sense, and the scope of the present invention is defined by the appended claims.

At least one halide gas is used in the compositions of the invention to effectuate the process. "Halide gas" or "halogen-containing gas," as used herein, encompass compounds containing one or more halogen atoms. These compounds may or may not be gases at room temperature (e.g., about 20° C. to about 25° C.), but they are capable of forming a gas (such as high vapor pressure liquids) under the appropriate conditions of temperature and pressure. It is also possible to use compounds in solid form at room temperature by heating to the point of sublimation prior to or after introduction into the reaction chamber. The process may include a chemical etching process or a dry (e.g., plasma) etching process.

The halide gas may, or may not, be able to effectively remove material (e.g., etch) by itself. If the halide gas is not capable of removing a particular iridium- and/or rhodium-containing material, at least one auxiliary gas (e.g., CO) that is capable of enhancing removal can be added to the halide gas.

In the following embodiments of the invention, a halide gas is supplied. The halide gas (i.e., a halogen-containing gas) is one that contains one or more elements from Group VIIA (Group 17) of the Periodic Table. For certain embodiments, this does not include $XeF_2$, at least because it is believed that bare silicon is required for etching to take place when $XeF_2$ is used. For other embodiments, the halogen-containing gas is one that optionally includes hydrogen and/or one or more elements from Groups IIIA (Group 13), IVA (Group 14), VA (Group 15), and VIA (Group 16) of the Periodic Table. The halide gas is preferably selected from the group of $F_2$, $Cl_2$, $Br_2$, $I_2$, $C_xF_y$ and $C_xCl_y$ (wherein x=1–6 and y=4–14), $C_xF_yH_z$, and $C_xCl_yH_z$ (wherein x=1–6, y=1–13, and z=1–13), $SF_6$, $SiF_4$, $SiCl_4$, $BF_3$, $BCl_3$, $NF_3$, HCl, HBr, $XeF_4$, and $XeF_6$, halogen oxides (i.e., oxyhalides, such as $ClO_2$ and $Cl_2O$), oxoacids (e.g., HOF and HOCl), interhalogens (e.g., compounds of the stoichiometries XY, $XY_3$, $XX'_2Y$, $XX'Y_2$, $XY_5$, and $XY_7$ wherein X and Y are both halogens but X is the heavier halogen, such as ClF, BrCl, IBr, ICl, BrF, $ClF_3$, $BrF_3$, $ClF_5$, $BrF_5$, $IF_5$, $IFCl_2$, and $IF_2Cl$), halogen oxyfluorides (e.g., $ClF_3O$), nitrosylhalides (e.g., $FNO_3$, $NF_3O$), and combinations thereof. More preferably, the halide gas is selected from the group of $F_2$, $Cl_2$, $Br_2$, $I_2$, $C_xF_y$ and $C_xCl_y$ (wherein x=1–6 and y=4–14), $C_xF_yH_z$ and $C_xCl_yH_z$ (wherein x=1–6, y=1–13, and z=1–13), $SF_6$, $SiF_4$, $SiCl_4$, $BF_3$, $BCl_3$, $NF_3$, HCl, HBr, halogen oxides, oxoacids, interhalogens (e.g., $ClF_3$), halogen oxyfluorides (e.g., $ClF_3O$), nitrosylhalides (e.g., $FNO_3$, $NF_3O$), and combinations thereof. There may be more than one halide gas in the etching composition. Such components may or may not be known etchants for a particular iridium- and/or rhodium-containing material. Preferably, however, the halide gas is capable of removing iridium- and/or rhodium-containing material in and of itself.

Optionally and preferably, at least one auxiliary gas is added to the at least one halide gas to form a composition for use in the methods of the present invention. The auxiliary gas may be added to the halide gas at any stage prior to or during interaction with the substrate. The auxiliary gas may also be injected into an etching chamber while the substrate is being exposed to the halide gas.

The auxiliary etching component is selected to provide effective removal of material from a substrate. It may be a solid or liquid at room temperature; typically, however, it is a gas at room temperature. Preferably, the auxiliary etching component is selected from the group of carbon monoxide (CO), nitric oxide (NO), alkylphosphines, isocyanides, and combinations thereof.

It is desirable to be able to selectively control the material being removed. For example, the composition used in the methods of the present invention can be tailored using components to remove exposed material beneath a patterned photoresist layer, without simultaneously removing the photoresist layer. Likewise, when more than one iridium- or rhodium-containing material is present at an exposed surface of a substrate, the composition can be tailored to effectively remove only one, or only selected layers, of the materials.

In a further embodiment of the invention, the composition can include components that assist in the formation of volatile products. For example, a source of oxygen can be used because the resultant rhodium and iridium oxyhalides are generally volatile. The source of oxygen can be, for example, oxygen ($O_2$), NO, $N_2O$, $NO_2$, oxyhalides such as $ClO_2$ and $Cl_2O$, $H_2O$, $H_2O_2$, $CO_2$, $SO_2$, $SO_3$, $O_3$, and combinations thereof. The source of oxygen may be added to the halide gas at any stage prior to or during interaction with the substrate. The source of oxygen may also be injected to an etching chamber while the substrate is being exposed to the halide gas.

The composition used in the methods of the present invention can Also include a carrier gas. The carrier gas can be unreactive with the substrate surface, or it can be a gas that forms ions that are involved in plasma etching. Examples of carrier gases include nitrogen, helium, argon, and mixtures thereof. Thus, this etching process may also include reactive ion etching, which typically employs argon as the reactive ion etch gas. Conditions for use of such gases is well known to one of skill in the art.

By varying combinations of pressure and temperature, variable etching characteristics can be obtained. For example, increasing the temperature of the composition used in the methods of the present invention normally increases the etching rate of the composition due to increasing the kinetic energy of the etching species. Likewise, the plasma radio frequency power conditions can also affect the etch rate.

According to the present invention, a substrate having material that is to be removed (e.g., a semiconductor-based substrate with an iridium- and/or rhodium-containing material of an exposed surface) is exposed to a composition that includes a halide gas. The iridium- and/or rhodium-containing material preferably forms an electrically conductive iridium-containing film (e.g., pure iridium, iridium oxide, iridium sulfide, iridium selenide, iridium nitride, etc.) or rhodium-containing film, (e.g., pure rhodium, rhodium oxide, rhodium sulfide, rhodium selenide, rhodium nitride, etc.). Specifically, the present invention is directed to a method of manufacturing a semiconductor device, particularly a ferroelectric device, having a rhodium and/or iridium-containing film. The rhodium and/or iridium-containing films formed are preferably conductive and can be used as barrier layers between a dielectric material and the silicon substrate in memory devices, such as ferroelectric memories, or as a plate (i.e., electrode) itself in a capacitor, for example. Because they are generally unreactive, such films are also suitable for use in optics applications as a reflective coating or as a high temperature oxidation barrier on carbon composites, for example. They can be deposited in a wide variety of thicknesses, depending on the desired use.

The compositions of the present invention can be used in a variety of systems and reactors. Two such systems are described with reference to FIGS. 1 and 2.

FIG. 1 illustrates a generic reactor 10 suitable for use with the present compositions and methods. A combination substrate chuck and heater 12 is located beneath a gas distribution shower head 14 within a reaction chamber 16. The compositions containing one or more halide compounds are introduced through the inlets 18, which are preferably gas inlets. Reaction by-products are drawn from the reaction chamber 16 through a vent 22 by a vacuum pump (not shown). The substrate 24 is located on the chuck 12 in the reaction chamber 16. The inside surface of the reaction chamber 16 may be constructed of steel to minimize reaction with the halide compounds.

A halide gas or vapor from a high vapor pressure liquid, for example, may be introduced into the inlet 18, or by other suitable means, to perform etching of substrate 24. The reaction chamber is preferably heated to a temperature of about −20° C. to about 800° C. for a period of about 10 seconds to about 10 minutes. Pressure is preferably maintained within the reaction chamber 16 at about 1.0 Torr (133 Pa) to about 800 Torr (106.6 kPa). It will be understood that the optimum temperature and pressure are a function of the halide compound and the material being etched. The halide compound may be removed from or flushed-out of the reaction chamber through the vent 22 by introduction of an inert gas at the inlet 18, such as argon.

Figure 2:
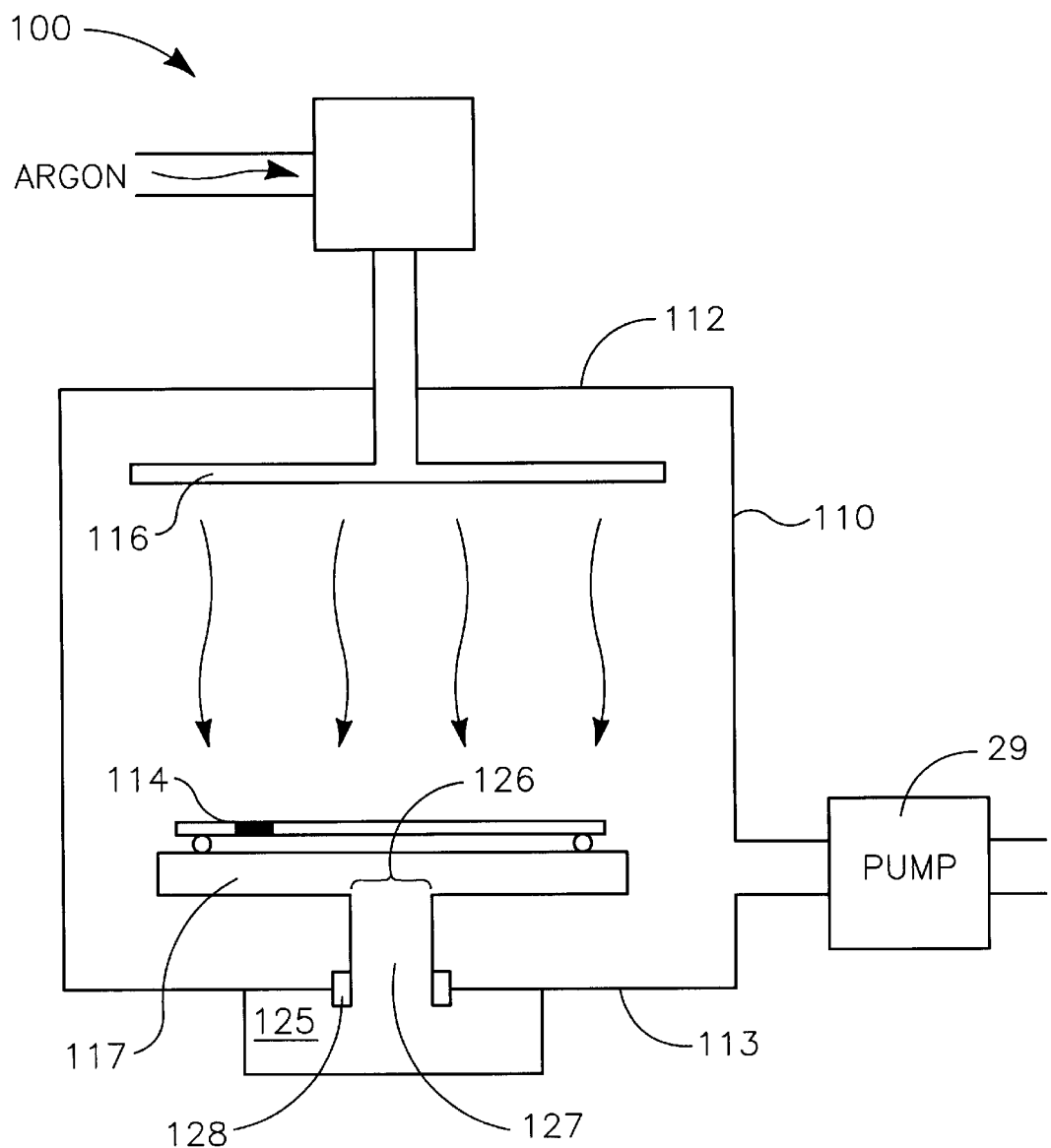
FIG. 2 is a partial cross-sectional view of a typical plasma etching chamber.

FIG. 2 is a partial cross-sectional view of a typical plasma etching chamber, generally indicated by the numeral 100. The chamber 100 includes of a hollow, cylindrical member 110 having upper and lower end plates 112 and 113, respectively. A pair of cylindrical, spaced apart, disc-shaped top and bottom electrodes 116 and 117, respectively, are positioned within the chamber 100. The bottom electrode 117, which can be made of aluminum or the like, has a central aperture 126 and is fixedly connected to a hollow metal pipe 127 which is insulated from the lower end plate 113 by a hermetic bushing 128. The lower end of pipe 127 is connected to a power source 125, preferably a radio frequency (RF) power source. A vacuum pump 129 serves to maintain a vacuum within chamber 100 and also to remove spent gases therein. A semiconductor wafer 114 is disposed on the bottom electrode 117. For purposes of this application, and for ease of discussion electrode 116 will be referred to as an anode, and electrode 117 will be referred to as a cathode. It is obvious to one skilled in the art that the anode need not be the top electrode and vice versa.

For this etching process, the plasma power is substantially within a range of about 100 Watts to about 3000 Watts. The reaction chamber is preferably heated to a temperature of about −20° C. to about 800° C. for a period of about 10 seconds to about 10 minutes. Within the reaction chamber 16 at about 1.0 Torr (133 Pa) to about 800 Torr (106.6 kPa). As above, it will be understood that the optimum temperature and pressure are a function of the halide compound and the material being etched.

The following example is meant to be illustrative of numerous embodiments of practicing the invention. They are meant to be understood as examples only, and not limiting on the scope of the invention.

EXAMPLE

Figure 3A:
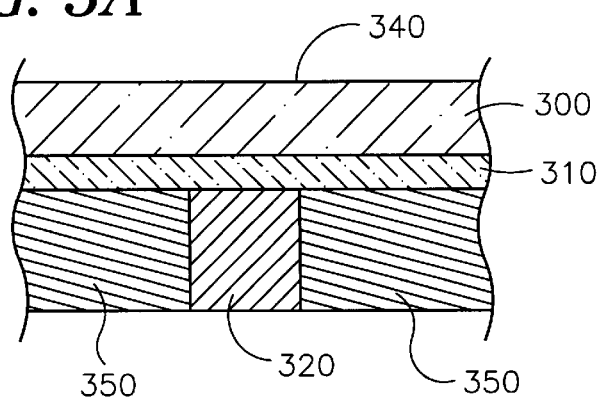
FIGS. 3A–3D represent a schematic of a design for bottom electrode formation in a storage cell for high-k dielectrics.
Figure 3B:
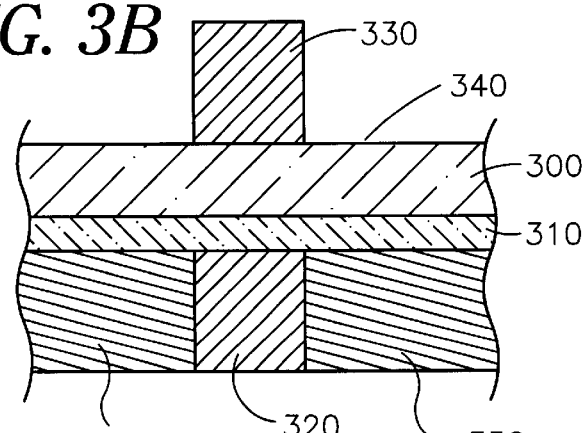
Figure 3C:
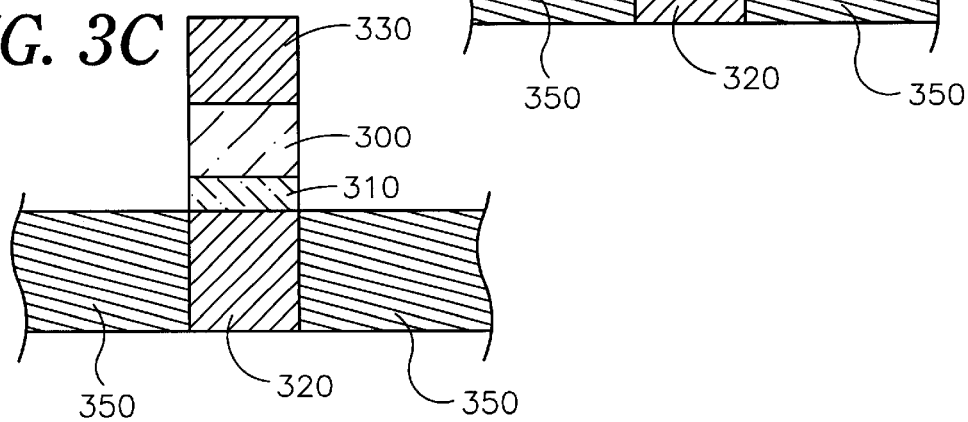
Figure 3D:
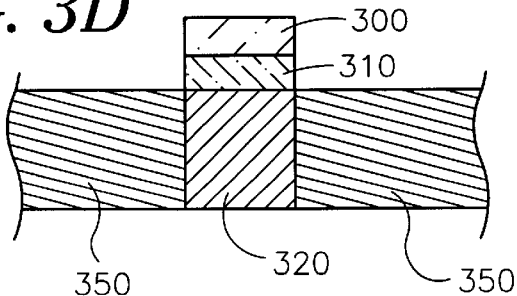

In reference to FIG. 3A, an iridium bottom electrode 300, is deposited onto a conductive barrier layer 310 that is in contact with a polysilicon plug 320 surrounded by an insulating material 350 such as BPSG. A subsequent photoresist layer 330 is spun onto surface 340 of the iridium electrode 300 and shown in FIG. 3B, developed by standard lithography to expose those areas of the iridium electrode layer 300 and conductive barrier layer 310 which are to be removed by a subsequent etch process. A reactive ion etch using $F_2$, CO, and Ar as etch gases is carried out for a time to remove the iridium electrode layer 300 and the conductive barrier layer 310, leaving a bottom electrode post on which the high-k dielectric material is deposited, as shown in FIGS. 3C and 3D.

All patents, patent applications, and publications disclosed herein are incorporated by reference in their entirety, as if individually incorporated. The foregoing detailed description and examples have been given for clarity of understanding only. No unnecessary limitations are to be understood therefrom. The invention is not limited to the exact details shown and described, for variations obvious to one skilled in the art will be included within the invention defined by the claims.

What is claimed is:

1. A method of removing a metal-containing material, the method comprising:
   providing a substrate comprising an exposed metal-containing material comprising rhodium; and
   exposing the substrate to a composition comprising at least one halogen-containing gas to remove at least a portion of the metal-containing material from the substrate, wherein the halogen-containing gas comprises one or more elements of Group VIIA (Group 17) of the Periodic Table, and optionally an element selected from the group of Hydrogen, Group IIIA (Group 13), Group IVA (Group 14), Group VA (Group 15), Group VIA (Group 16) of the Periodic Table, and combinations thereof.

2. The method of claim 1, wherein providing the substrate comprises providing a substrate comprising an exposed metal-containing material, wherein the metal-containing material is selected from the group of a rhodium film, a rhodium oxide film, and combinations thereof.

3. The method of claim 1, wherein providing the substrate comprises providing a substrate having a patterned mask layer thereon, and wherein the material removed from the substrate comprises exposed material under the patterned mask layer.

4. The method of claim 1, wherein exposing the substrate comprises exposing the substrate to a composition comprising at least one halogen-containing gas and at least one auxiliary gas.

5. The method of claim 4, wherein the auxiliary gas is selected from the group of carbon monoxide, nitric oxide, alkylphosphines, isocyanides, and combinations thereof.

6. The method of claim 1, wherein exposing the substrate comprises exposing the substrate to a composition comprising at least one halogen-containing gas and at least one source of oxygen.

7. The method of claim 6, wherein the source of oxygen is selected from the group of $O_2$, NO, $N_2O$, $NO_2$, oxyhalides, $H_2O$, $H_2O_2$, $CO_2$, $SO_2$, $SO_3$, $O_3$, and combinations thereof.

8. The method of claim 1, wherein the halogen-containing gas is selected from the group consisting of $F_2$, $Cl_2$, $Br_2$, $I_2$, $C_xF_y$ and $C_xCl_y$ wherein x=1–6 and y=4–14, $C_xF_yH_z$ and $C_xCl_yH_z$ wherein x=1–6, y=1–13, and z=1–13, $SF_6$, $SiF_4$, $SiCl_4$, $BF_3$, $BCl_3$, $NF_3$, HCl, HBr, $XeF_4$, $XeF_6$, a halogen oxide, an oxoacid, an interhalogen, a halogen oxyfluoride, a nitrosylhalide, and combinations thereof.

9. The method of claim 1, wherein the substrate is a semiconductor-based substrate or substrate assembly.

10. The method of claim 9, wherein the semiconductor-based substrate is a wafer.

11. The method of claim 1, wherein the metal-containing material is an electrode in a high-k dielectric capacitor.

12. The method of claim 1, wherein the substrate forms a part of an etch chamber.

13. The method of claim 1, wherein the substrate forms a part of a deposition chamber.

14. The method of claim 1, wherein the halogen-containing gas is a liquid at room temperature.

15. The method of claim 1, wherein the halogen-containing gas is a solid at room temperature.

16. The method of claim 1, wherein exposing the substrate to a composition comprising at least one halogen-containing gas comprises exposing the substrate to the composition under plasma etching conditions.

17. A method of removing a metal-containing material, the method comprising:
    providing a substrate comprising an exposed metal-containing material comprising rhodium; and
    exposing the substrate to a composition comprising at least one halogen-containing gas and at least one auxiliary gas to remove at least a portion of the metal-containing material from the substrate.

18. The method of claim 17, wherein providing the substrate comprises providing a substrate comprising an exposed metal-containing material, wherein the metal-containing material is selected from the group of a rhodium film, a rhodium oxide film, and combinations thereof.

19. The method of claim 17, wherein providing the substrate comprises providing a substrate having a patterned mask layer thereon, and wherein the material removed from the substrate comprises exposed material under the patterned mask layer.

20. The method of claim 17, wherein the auxiliary gas is selected from the group of carbon monoxide, nitrous oxide, alkylphosphines, isocyanides, and combinations thereof.

21. The method of claim 17, wherein exposing the substrate to a composition comprising at least one halogen-containing gas comprises exposing the substrate to the composition under plasma etching conditions.

22. A method of removing a metal-containing material, the method comprising:
    providing a substrate comprising an exposed metal-containing material comprising rhodium; and
    exposing the substrate to a composition comprising at least one halogen-containing gas and at least one oxygen-containing gas to remove at least a portion of the metal-containing material from the substrate.

23. The method of claim 22, wherein the composition further comprises at least one auxiliary gas.

24. The method of claim 23, wherein the auxiliary gas is selected from the group of carbon monoxide, nitric oxide, alkylphosphines, isocyanides, and combinations thereof.

25. The method of claim 22, wherein the source of oxygen is selected from the group of $O_2$, NO, $N_2O$, $NO_2$, oxyhalides, $H_2O$, $H_2O_2$, $CO_2$, $SO_2$, $SO_3$, $O_3$, and combinations thereof.

26. The method of claim 1, wherein the metal-containing material comprises rhodium and one or more other metals, one or more metalloids, or combinations thereof.

27. The method of claim 26, wherein the metal-containing material comprises rhodium and a metal selected from the group of iridium, nickel, palladium, platinum, iron, ruthenium, osmium, and combinations thereof.

28. The method of claim 17, wherein the metal-containing material comprises rhodium and one or more other metals, one or more metalloids, or combinations thereof.

29. The method of claim 28, wherein the metal-containing material comprises rhodium and a metal selected from the group of iridium, nickel, palladium, platinum, iron, ruthenium, osmium, and combinations thereof.

30. The method of claim 22, wherein the metal-containing material comprises rhodium and one or more other metals, one or more metalloids, or combinations thereof.

31. The method of claim 30, wherein the metal-containing material comprises rhodium and a metal selected from the group of iridium, nickel, palladium, platinum, iron, ruthenium, osmium, and combinations thereof.

32. A method of removing a metal-containing material, the method comprising:

providing a substrate comprising an exposed metal-containing material comprising rhodium, iridium, or combinations thereof, and exposing the substrate to a composition comprising at least one halogen-containing gas and at least one auxiliary gas to remove at least a portion of the metal-containing material from the substrate, wherein the halogen-containing gas comprises one or more elements of Group VIIA (Group 17) of the Periodic Table, and optionally an element selected from the group of Hydrogen, Group IIIA (Group 13), Group IVA (Group 14), Group VA (Group 15), Group VIA (Group 16) of the Periodic Table, and combinations thereof, and wherein the auxiliary gas is selected from the group of nitrous oxide, alkylphosphines, isocyanides, and combinations thereof.

33. The method of claim 32, wherein providing the substrate comprises providing a substrate comprising an exposed metal-containing material, wherein the metal-containing material is selected from the group of an iridium film, an iridium oxide film, a rhodium film, a rhodium oxide film, and combinations thereof.

34. The method of claim 32, wherein the metal-containing material comprises rhodium and one or more other metals, one or more metalloids, or combinations thereof.

35. The method of claim 34, wherein the metal-containing material comprises rhodium and a metal selected from the group of iridium, nickel, palladium, platinum, iron, ruthenium, osmium, and combinations thereof.

36. A method of removing a metal-containing material, the method comprising:

providing a substrate comprising an exposed metal-containing material comprising rhodium, iridium, or combinations thereof; and exposing the substrate to a composition comprising at least one halogen-containing gas and at least one auxiliary gas to remove at least a portion of the metal-containing material from the substrate, wherein the auxiliary gas is selected from the group of nitrous oxide, alkylphosphines, isocyanides, and combinations thereof.

37. The method of claim 36, wherein providing the substrate comprises providing a substrate comprising an exposed metal-containing material, wherein the metal-containing material is selected from the group of an iridium film, an iridium oxide film, a rhodium film, a rhodium oxide film, and combinations thereof.

38. The method of claim 36, wherein the metal-containing material comprises rhodium and one or more other metals, one or more metalloids, or combinations thereof.

39. The method of claim 38, wherein the metal-containing material comprises rhodium and a metal selected from the group of iridium, nickel, palladium, platinum, iron, ruthenium, osmium, and combinations thereof.

40. A method of removing a metal-containing material, the method comprising:

providing a substrate comprising an exposed metal-containing material comprising a metal alloy comprising rhodium, iridium, or combinations thereof; and exposing the substrate to a composition comprising at least one halogen-containing gas to remove at least a portion of the metal-containing material from the substrate, wherein the halogen-containing gas comprises one or more elements of Group VIIA (Group 17) of the Periodic Table, and optionally an element selected from the group of Hydrogen, Group IIIA (Group 13), Group IVA (Group 14), Group VA (Group 15), Group VIA (Group 16) of the Periodic Table, and combinations thereof.

* * * * *